(12) United States Patent
Umeda et al.

(10) Patent No.: US 7,414,497 B2
(45) Date of Patent: Aug. 19, 2008

(54) PIEZOELECTRIC THIN-FILM FILTER

(75) Inventors: Keiichi Umeda, Omihachiman (JP);
Hideki Kawamura, Tokyo-to (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 11/933,720

(22) Filed: Nov. 1, 2007

(65) Prior Publication Data
US 2008/0048803 A1    Feb. 28, 2008

Related U.S. Application Data

(63) Continuation of application No. PCT/JP2006/311629, filed on Jun. 9, 2006.

(30) Foreign Application Priority Data

Jun. 20, 2005    (JP) .............................. 2005-178987

(51) Int. Cl.
*H03H 9/54* (2006.01)
*H03H 3/02* (2006.01)
(52) U.S. Cl. ...................................... 333/190; 333/189
(58) Field of Classification Search ................. 333/189, 333/190
See application file for complete search history.

(56) References Cited

U.S. PATENT DOCUMENTS

| | | | | |
|---|---|---|---|---|
| 2,222,417 A | * | 11/1940 | Mason | 333/190 |
| 2,452,114 A | * | 10/1948 | Farkas | 333/190 |
| 2,929,031 A | * | 3/1960 | Kosowsky | 333/190 |
| 2,980,872 A | * | 4/1961 | Storch | 333/190 |
| 7,271,684 B2 | * | 9/2007 | Nishihara et al. | 333/133 |

2004/0263286 A1    12/2004 Unterberger

FOREIGN PATENT DOCUMENTS

| | | |
|---|---|---|
| JP | 03-165614 7 | 7/1991 |
| JP | 09-284092 | 10/1997 |

(Continued)

OTHER PUBLICATIONS

International Search Report PCT/JP2006/311629 dated Sep. 4, 2006.

(Continued)

*Primary Examiner*—Barbara Summons
(74) *Attorney, Agent, or Firm*—Dickstein Shapiro LLP

(57) ABSTRACT

Providing is a piezoelectric thin-film filter including resonators connected in a lattice pattern, which can achieve large attenuation at frequencies away from a passband and improve steepness near two ends of the passband without involving an additional special step. Second resonators $C\_2$ or first and third resonators $C\_1$ and $Cx\_1$ connected in parallel form series-arm resonators or parallel-arm resonators $C\_1$ connected in a lattice pattern. The capacitance of each second resonator $C\_2$ is larger than the capacitance of each first resonator $C\_1$. The capacitance of each third resonator $Cx\_1$ is substantially equal to the difference between the capacitance of the second resonator $C\_2$ and the capacitance of the first resonator $C\_1$. The resonant frequency of the first resonator $C\_1$ higher than the resonant frequency of the second resonator $C\_2$. The anti-resonant frequency of the third resonator $Cx\_1$ is higher than the resonant frequency of the second resonator $C\_2$ and lower than the resonant frequency of the first resonator $C\_1$.

19 Claims, 12 Drawing Sheets

FOREIGN PATENT DOCUMENTS

| | | |
|---|---|---|
| JP | 10-065491 | 3/1998 |
| JP | 10-242797 | 9/1998 |
| JP | 2001-223559 | 8/2001 |
| JP | 2002-198777 7 | 7/2002 |
| JP | 2003-022074 | 1/2003 |
| JP | 2003-347889 | 12/2003 |
| JP | 2004-048516 | 2/2004 |
| JP | 2005-073298 | 3/2005 |
| JP | 2005-2178527 | 8/2005 |
| JP | 2005-311568 | 11/2005 |
| WO | WO 2004/034579 | 4/2004 |
| WO | WO 2004/066490 | 8/2004 |
| WO | WO 2006/137275 | 12/2006 |

OTHER PUBLICATIONS

Written Opinion PCT/JP2006/311629 dated Sep. 4, 2006.

* cited by examiner

FIG. 23 – Prior Art

PIEZOELECTRIC THIN-FILM FILTER

This is a continuation of application Ser. No. PCT/JP2006/311629, filed Jun. 9, 2006.

TECHNICAL FIELD

The present invention relates to piezoelectric thin-film filters, and more particularly to a piezoelectric thin-film filter including resonators connected in a lattice pattern.

BACKGROUND ART

A proposal has been made to add capacitors in order to achieve steep filter characteristics in a filter including resonators connected in a lattice pattern.

For example, as shown in FIG. 23, a proposal has been made for a circuit configuration of a surface acoustic wave (SAW) filter 1 including series-arm resonators 4 and 7 and parallel-arm resonators 8 and 9 connected in a lattice pattern between input terminals 2 and 5 and output terminals 3 and 6, and capacitors 10 and 11 connected in parallel to the parallel-arm resonators 8 and 9, respectively (for example, see Patent Document 1).

Patent Document 1: Japanese Patent No. 3389911

DISCLOSURE OF INVENTION

Problems to be Solved by the Invention

With such a circuit configuration, the steepness of filter characteristics at a lower frequency side of a passband is improved in the case where the frequency of each series-arm resonator is higher than that of each parallel-arm resonator, thereby achieving large attenuation at frequencies away from the passband. In contrast, when the frequency of each series-arm resonator is lower than that of each parallel-arm resonator, filter characteristics that are steep at a higher frequency side, which is the opposite side from the above, of the passband are achieved.

In a SAW filter, each parallel-arm resonator and each series-arm resonator have the same $\gamma$ value ($=1/k^2$). In the case where the $\gamma$ values of the parallel-arm resonator and the series-arm resonator are the same and only the resonant frequencies thereof are different, an attenuation pole is not formed near the passband, resulting in deterioration of the steepness of the filter characteristics near the passband. To solve this problem, the steepness of the filter characteristics can be improved by adding capacitors as described in Patent Document 1. For example, one such additional capacitor can be formed at the same time as the resonators by forming a pair of comb-like electrodes on a piezoelectric substrate.

The area of each electrode is adjusted so that the capacitance of the parallel-arm resonator becomes smaller than that of the series-arm resonator. For example, the capacitance of the parallel-arm resonator can be 0.18 pF when the capacitance of the series-arm resonator is 0.3 pF and the additional capacitance is 0.12 pF. In this case, the sum of the capacitance 0.18 pF of the parallel-arm resonator and the additional capacitance 0.12 pF is equal to the capacitance 0.3 pF of the series-arm resonator. Therefore, the impedance of the parallel-arm resonator including the additional capacitance and the impedance of the series-arm resonator are the same at frequencies away from the resonant frequencies. Accordingly, large attenuation can be achieved at frequencies away from the passband.

FIG. 1$a$ shows an equivalent circuit of one resonator in which $L_1$ denotes a series inductance, $C_1$ denotes a series capacitor, $R_1$ denotes a series resistor, and $C_0$ denotes a parallel capacitor. When an additional capacitor Cx is connected in parallel to the resonator, the circuit shown in FIG. 1$b$ is obtained. When the additional capacitance Cx is connected in parallel, the series capacitance $C_1$ remains the same, and the parallel capacitance becomes equal to $C_0'=C_0+Cx$ in the resonator. The capacitance ratio is increased from $\gamma=C_0/C_1=1/k^2$ (where k is an electrochemical coefficient) to $\gamma'=C_0'/C_1=1/k'^2$. Therefore, the parallel-arm resonator including the additional capacitor connected in parallel can be regarded as a resonator having a larger $\gamma$ value than the series-arm resonator and the same parallel capacitance as the series-arm resonator.

Hereinafter, the reason $k^2=2\cdot\Delta f/fr=1/\gamma=C_1/C_0$ (or $k^2=C_1/C_0'$) holds true will be described.

First, it is defined that $k^2=2\cdot\Delta f/fr$ where $\Delta f=fa-fr$, and fr denotes a resonant frequency and fa denotes an anti-resonant frequency.

Using parameters of the equivalent circuit shown in FIG. 1$a$, the following will be derived:

$$fr=1/\{2\pi(L_1\cdot C_1)^{1/2}\}$$

$$fa=1/[2\pi\{L_1\cdot C_0\cdot C_1/(C_0+C_1)\}^{1/2}]=fr\cdot(1+1/\gamma)^{1/2}$$

Since $1<<\gamma$, $$fa=fr\cdot(1+1/\gamma)^{1/2}\approx fr\cdot\{1+1/(2\cdot\gamma)\}$$

Thus, $$\Delta f=fa-fr=fr/(2\cdot\gamma), \text{ and}$$

$$k^2=2\cdot\Delta f/fr=1/\gamma=C_1/C_0$$

In the case where the circuit configuration of a SAW filter including additional capacitors as has been described above is simply exchanged with a bulk-acoustic-wave (BAW) filter, the forming of capacitors on a substrate requires an additional special step of forming the capacitors.

In view of these circumstances, the present invention provides a piezoelectric thin-film filter including resonators connected in a lattice pattern which can achieve large attenuation at frequencies away from a passband and improve steepness near two ends of the passband without involving an additional special step.

Means for Solving the Problems

In order to solve the foregoing problems, the present invention provides a piezoelectric thin-film filter configured with a structure described below.

The piezoelectric thin-film filter includes pluralities of first, second and third resonators, each resonator including a pair of electrodes sandwiching a piezoelectric thin film. The second resonators or the first and third resonators connected in parallel each constitute series-arm resonators or parallel-arm resonators connected in a lattice pattern. The capacitance of each of the second resonators is larger than the capacitance of each of the first resonators. The capacitance of each of the third resonators is substantially equal to the difference between the capacitance of any one of the second resonators and the capacitance of any one of the first resonators. The resonant frequency of each of the first resonators is higher than the resonant frequency of each of the second resonators.

The anti-resonant frequency of each of the third resonators is higher than the resonant frequency of each of the second resonators and lower than the resonant frequency of each of the first resonators.

With the above-described structure, the second resonators constitute series-arm resonators connected in a lattice pattern, and the first and third resonators connected in parallel constitute parallel-arm resonators connected in a lattice pattern. Alternatively, the second resonators may constitute parallel-arm resonators connected in a lattice pattern, and the first and third resonators connected in parallel may constitute series-arm resonators connected in a lattice pattern.

With the above-described structure, the capacitance of each of the series-arm resonators is substantially equal to the capacitance of each of the parallel-arm resonators. Accordingly, large attenuation can be achieved at frequencies away from a passband.

Further, filter characteristics in which the attenuation is steep at two sides of the passband can be achieved. That is, each of the third resonators connected in parallel to a corresponding one of the first resonators has capacitance between the resonant frequency and the anti-resonant frequency of the first resonator, which is thus equivalent to adding a capacitor to the first resonator. Therefore, the third resonator permits the anti-resonant point of the first resonator to be made closer to the resonant point of the first resonator, thereby improving the steepness of the filter characteristics at a higher frequency side of the passband. In contrast, a frequency (pole) at which the impedance of the first and third resonators connected in parallel becomes equal to the impedance of the second resonator, including the sign, is obtained near a lower frequency side of the passband. Accordingly, the steepness of the filter characteristics at the lower frequency side of the passband can be improved.

Preferably, the resonant frequency of each of the third resonators matches the resonant frequency of each of the second resonators.

With the above-described structure, the third resonators and the second resonators can be formed using the same film thickness, resulting in a reduction in the number of steps in the case where the piezoelectric thin-film filter is configured using BAW resonators employing vibration in the thickness direction. Also, filter characteristics in which the attenuation is steep at the lower frequency end of the passband can be achieved.

Preferably, the sum of the capacitance of any one of the first resonators and the capacitance of any one of the third resonators is equal to the capacitance of any one of the second resonators.

With the above-described structure, the impedances match each other outside the passband by making the capacitance of each of the series-arm resonators equal to the capacitance of each of the parallel-arm resonators, thereby achieving a filter that achieves large out-of-band attenuation.

Preferably, the sum of the capacitance of any one of the first resonators and the capacitance of any one of the third resonators is different from the capacitance of any one of the second resonators.

With the above-described structure, attenuation poles can be formed on two outside sides of the passband since the capacitance of each of the series-arm resonators is different from the capacitance of each of the parallel-arm resonators. Accordingly, a filter with steeper attenuation characteristics can be obtained.

Preferably, the difference between the anti-resonant frequency and the resonant frequency of any one of the first resonators is smaller than the difference between the anti-resonant frequency and the resonant frequency of any one of the second resonators.

With the above-described structure, a filter with characteristics in which the attenuation at two sides of the passband is steep can be obtained by using two operating frequencies.

Advantages

According to a piezoelectric thin-film filter of the present invention, large attenuation can be achieved at frequencies away from a passband, and the steepness of filter characteristics near two ends of the passband can be improved without involving an additional special step.

BRIEF DESCRIPTION OF THE DRAWINGS

FIG. 23 is a circuit diagram of a filter (known example).

Figure 1A:
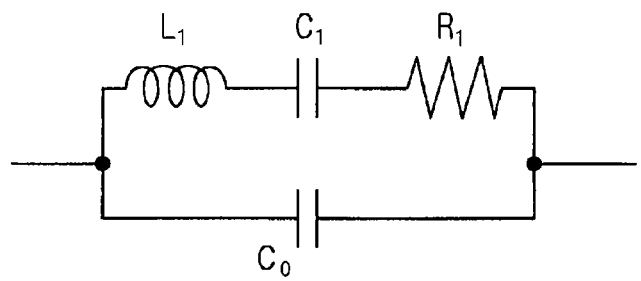
FIG. 1 includes circuit diagrams of an equivalent circuit of a resonator and an equivalent circuit of the resonator including an additional capacitor.
Figure 1B:
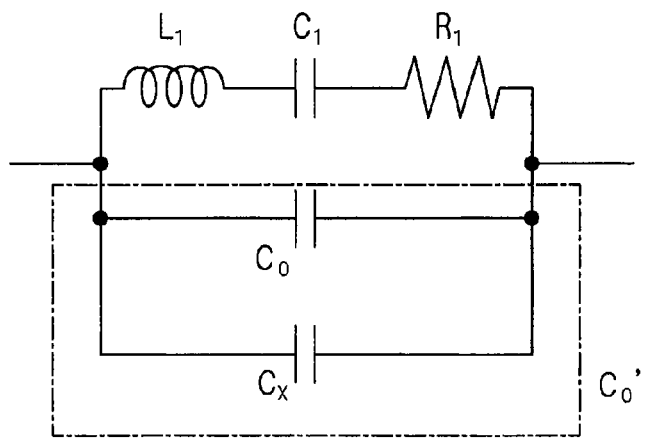
Figure 2:
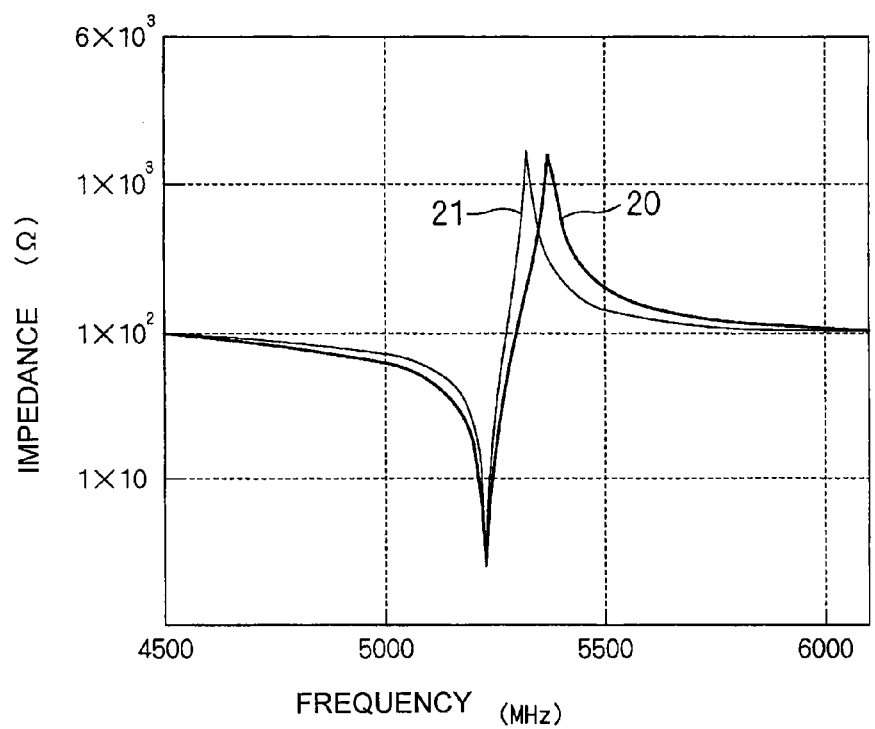
FIG. 2 is a graph showing impedance characteristics.

REFERENCE NUMERALS 10 and 40: filters
C_1: parallel-arm resonators (first resonators)
C_2: series-arm resonators (second resonators)
Cx_1: additional resonators (third resonators)

BEST MODE FOR CARRYING OUT THE INVENTION

Embodiments of the present invention will be described with reference to FIGS. 3 to 22.

First Embodiment

A piezoelectric thin-film filter 10 according to a first embodiment will be described with reference to FIGS. 3 to 11.

Figure 3:
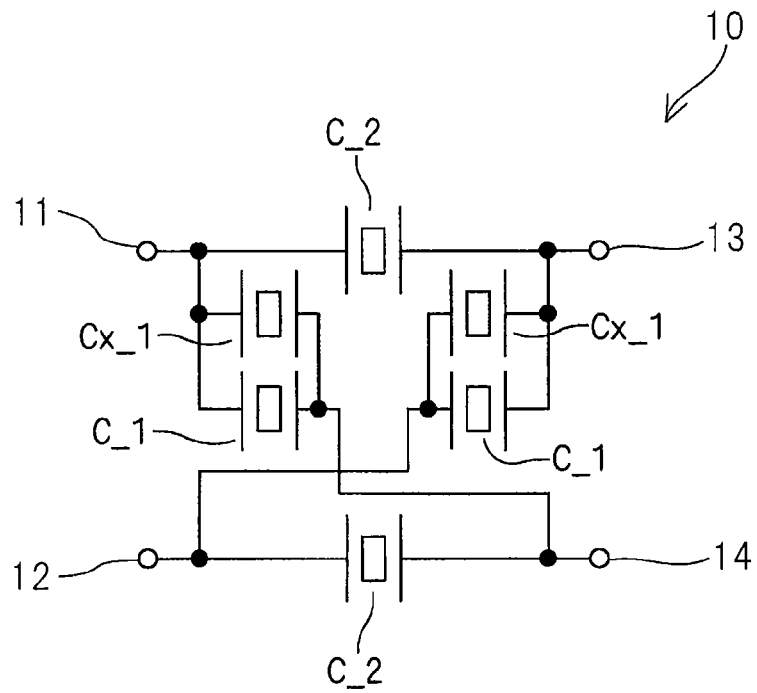
FIG. 3 is a circuit diagram of a filter (first embodiment)

As shown in the circuit diagram of FIG. 3, the piezoelectric thin-film filter 10 is a lattice filter including series-arm resonators C_2 and parallel-arm resonators C_1 connected in a lattice pattern. That is, the two series-arm resonators C_2 are connected between an input terminal 11 and an output terminal 13 and between an input terminal 12 and an output terminal 14, respectively. The two parallel-arm resonators C_1 are connected between the input terminal 11 and the output terminal 14 and between the input terminal 12 and the output terminal 13, respectively. Further, additional resonators Cx_1 are connected in parallel to the corresponding parallel-arm resonators C_1.

The capacitance of each series-arm resonator C_2 is larger than that of each parallel-arm resonator C_1. The capacitance of each additional resonator Cx_1 is substantially equal to the difference between the capacitance of the series-arm resonator C_2 and the capacitance of the parallel-arm resonator C_1. Accordingly, the piezoelectric thin-film filter 10 can achieve large attenuation at frequencies away from a passband.

The resonant frequency of the parallel-arm resonator C_1 is higher than the resonant frequency of the series-arm resonator C_2. The anti-resonant frequency of the additional resonator Cx_1 is higher than the resonant frequency of the series-arm resonator C_2 and lower than the resonant frequency of the parallel-arm resonator C_1. Accordingly, filter characteristics attenuating steeply at a higher frequency side of the passband can be achieved.

That is, the additional resonator Cx_1 connected in parallel to the corresponding parallel-arm resonator C_1 has a capacitance between the resonant frequency and the anti-resonant frequency of the parallel-arm resonator C_1, which is thus equivalent to adding a capacitor in parallel to the parallel-arm resonator C_1. Therefore, the anti-resonant point of the parallel-arm resonator C_1 can be made closer to the resonant point of the parallel-arm resonator C_1 with the additional resonator Cx_1, thereby improving the steepness of the filter characteristics at the higher frequency side of the passband.

In contrast, a frequency (pole) at which the composite impedance of the parallel-arm resonator C_1 and the additional resonator Cx_1 connected in parallel becomes equal to the impedance of the series-arm resonator C_2, including the sign, is obtained near a lower frequency side of the passband. Accordingly, the steepness of the filter characteristics at the lower frequency side of the passband can be improved.

As an example, the case where the capacitance of the parallel-arm resonator C_1 is 0.18 pF, the capacitance of the series-arm resonator C_2 is 0.3 pF, and the capacitance of the additional resonator Cx_1 is 0.12 pF will be described.

The anti-resonant frequency of the parallel-arm resonator C_1 is 5460 MHz, and $k^2$=5.8%. The anti-resonant frequency of the additional resonator Cx_1 is 5240 MHz, and $k^2$=5.8%. The anti-resonant frequency of the series-arm resonator C_2 is 5265 MHz, and $k^2$=5.8%.

Figure 4:
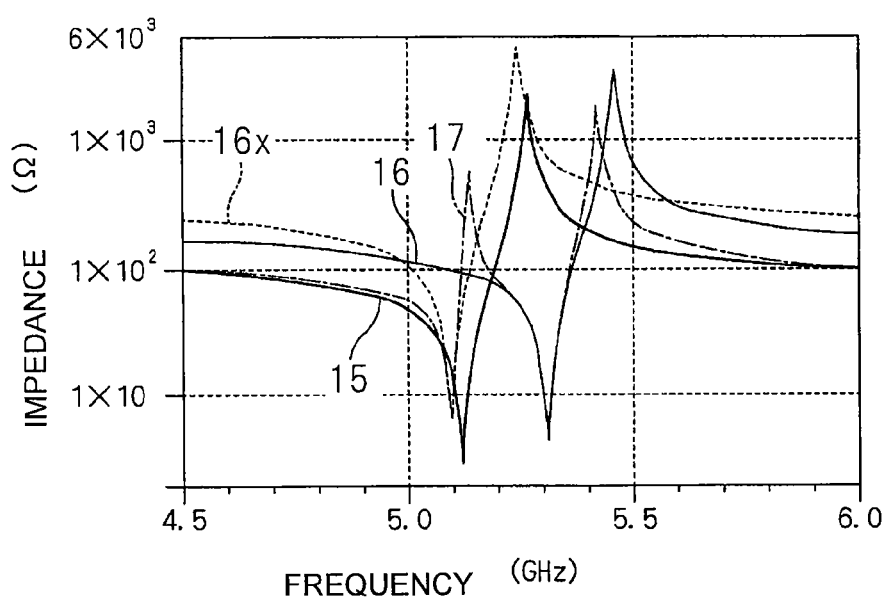
FIG. 4 is a graph of impedance characteristics (first embodiment)
Figure 5:
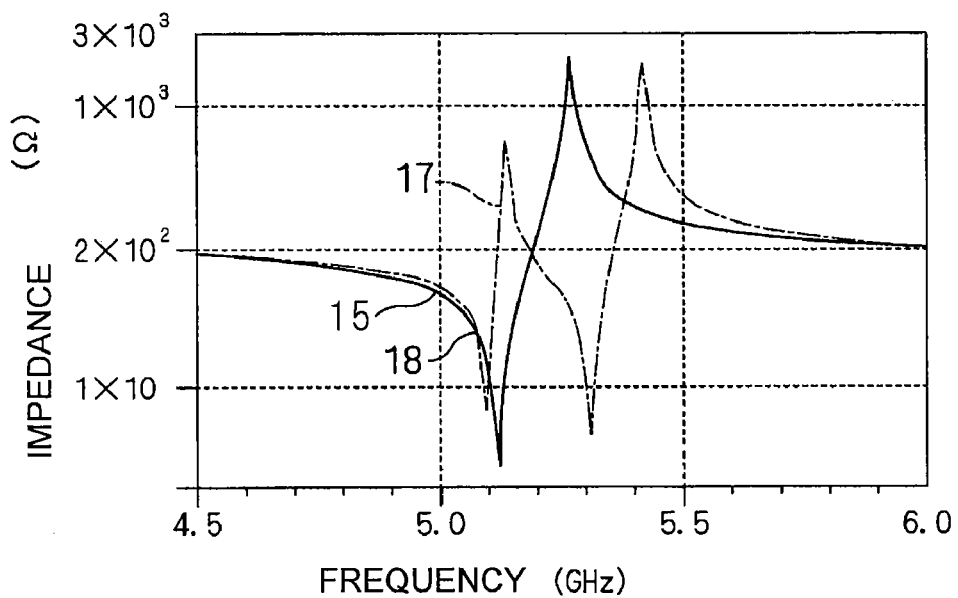
FIG. 5 is a graph of impedance characteristics (first embodiment)
Figure 6:
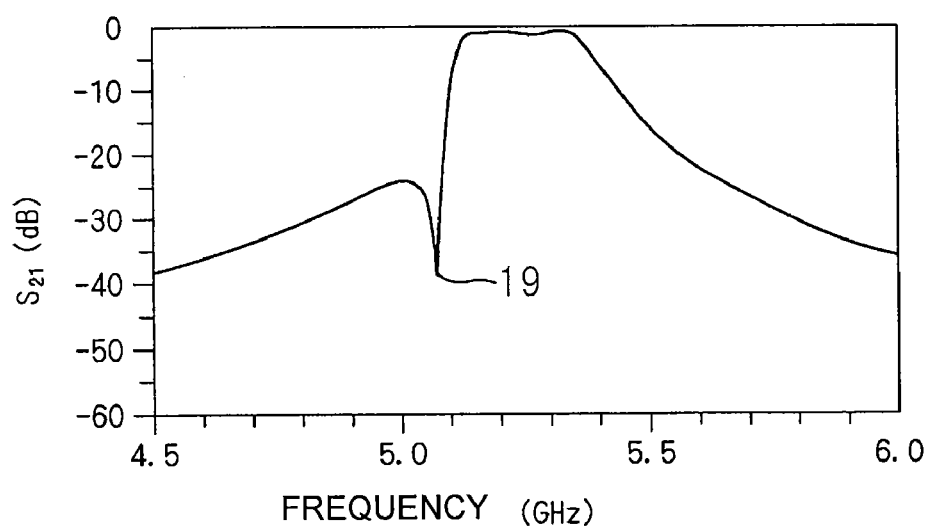
FIG. 6 is a graph of filter characteristics (first embodiment)
Figure 7:
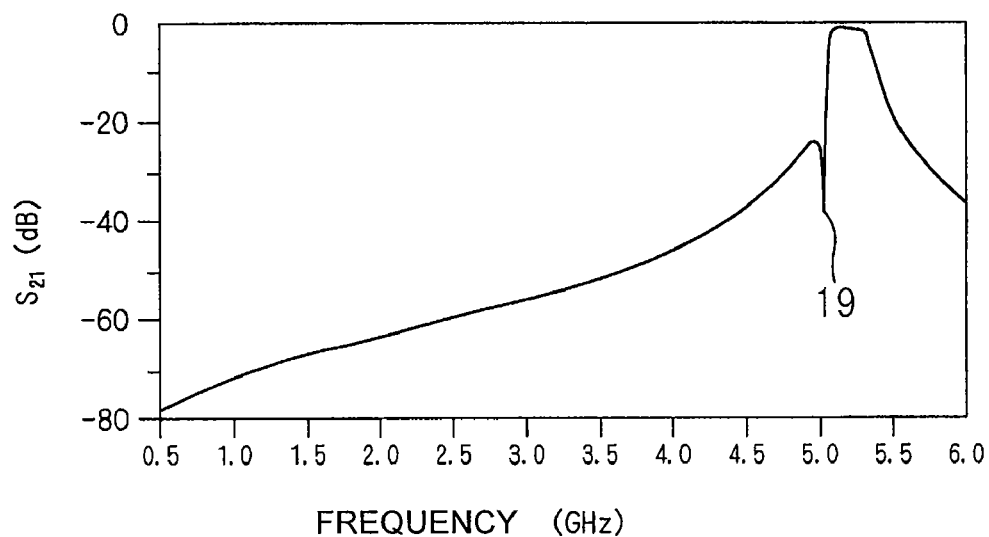
FIG. 7 is a graph of filter characteristics (first embodiment)

FIGS. 4 and 5 show impedance characteristics of the resonators in the case where the operating frequency of each resonator is different. FIGS. 6 and 7 show filter characteristics. FIG. 5 is an enlarged illustration of a part of the graph shown in FIG. 4. FIG. 6 is an enlarged illustration of a part of the graph shown in FIG. 7.

Referring to FIGS. 4 and 5, the bold line 15 represents impedance characteristics of the series-arm resonator C_2; the thin line 16 represents impedance characteristics of the parallel-arm resonator C_1; the broken line 16x represents impedance characteristics of the additional resonator Cx_1; and the chain line 17 represents the composite impedance obtained by connecting the parallel-arm resonator C_1 and the additional resonator Cx_1 in parallel to each other.

Since the parallel-arm resonator C_1 and the additional resonator Cx_1 have different operating frequencies, the additional resonator Cx_1 only has capacitance characteristics in a range between the resonant frequency and the anti-resonant frequency of the parallel-arm resonator C_1, which thus becomes equivalent to a state in which a capacitance is added, as in Patent Document 1. Therefore, $k^2$ changes according to a principle similar to that described in Patent Document 1.

As shown in FIG. 5, the impedance characteristic curve 15 of the series-arm resonator C_2 matches the composite impedance characteristic curve 17 of the parallel-arm resonator C_1 and the additional resonator Cx_1 at a point 18 (5.070 GHz, 23.902 Ω) outside the passband. Accordingly, as shown in FIGS. 6 and 7, an attenuation pole 19 is formed near the passband, and steep filter characteristics in which out-of-band attenuation is large can be achieved.

In this example, the three types of resonators C_1, C_2, and Cx_1 have different operating frequencies. Therefore, in the case where the piezoelectric thin-film filter 10 is fabricated using BAW resonators, the film thickness and structure of the resonators C_1, C_2, and Cx_1 must be made different, resulting in an increase the number of steps.

Figure 8:
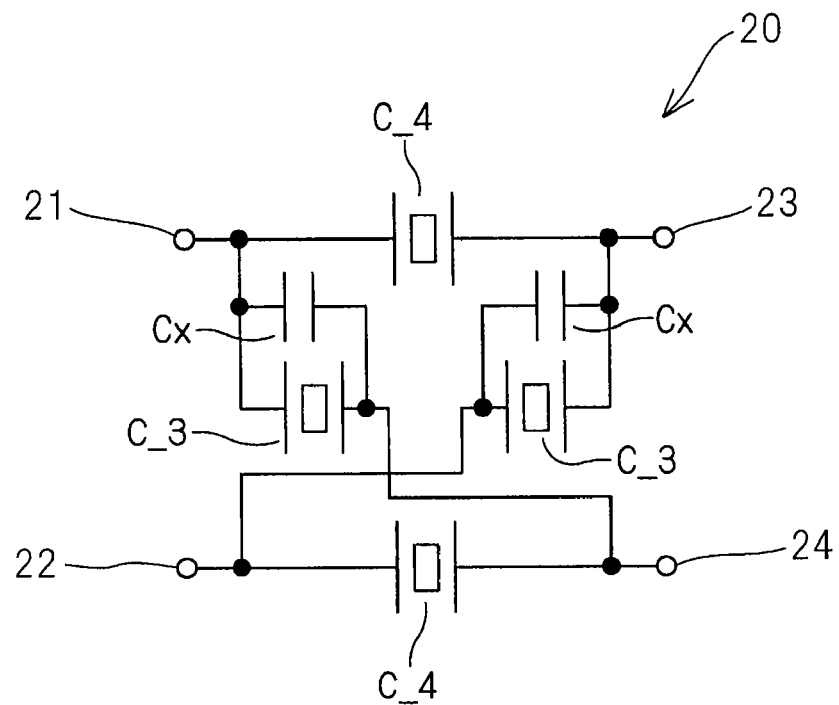
FIG. 8 is a circuit diagram of a filter (comparative example)

FIG. 8 is a circuit diagram of a lattice filter 20 according to a comparative example. The lattice filter 20 of the comparative example includes two series-arm resonators C_4 and two parallel-arm resonators C_3 connected in a lattice pattern between input terminals 21 and 22 and output terminals 23 and 24. Capacitors Cx are connected in parallel to the corresponding parallel-arm resonators C_3. Parameters of the lattice filter 20 are the same as those of the piezoelectric thin-film filter 10 of the first embodiment. That is, each parallel-arm resonator C_3 has a capacitance of 0.18 pH, an anti-resonant frequency of 5460 MHz, and $k^2$=5.8%. The capacitance of each additional capacitor is 0.12 pH. Each series-arm resonator C_4 has a capacitance of 0.30 pH, an anti-resonant frequency of 5265 MHz, and $k^2$=5.8%.

Figure 9:
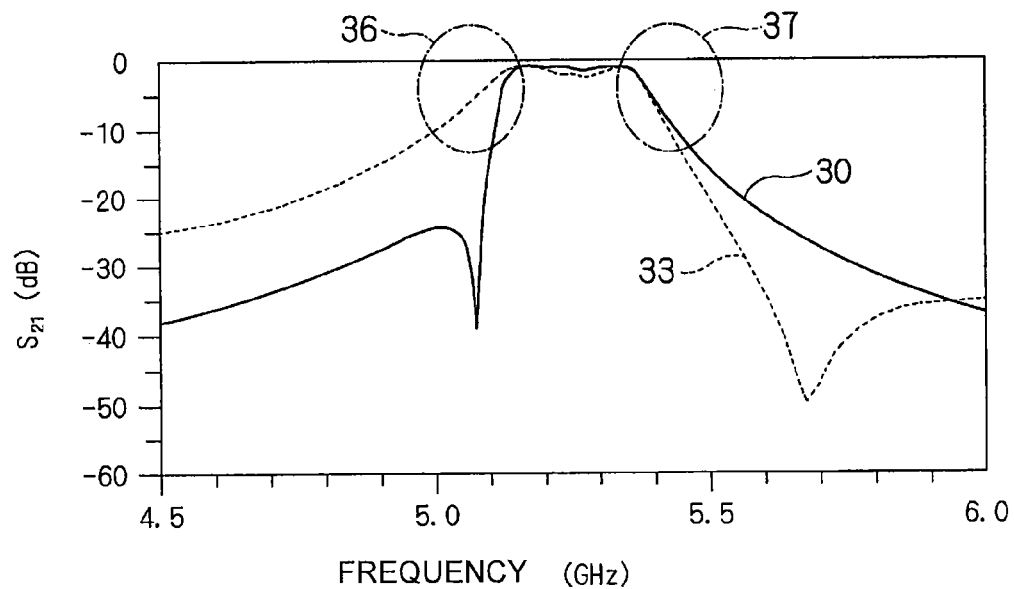
FIG. 9 is a graph of filter characteristics (first embodiment and comparative example)
Figure 10:
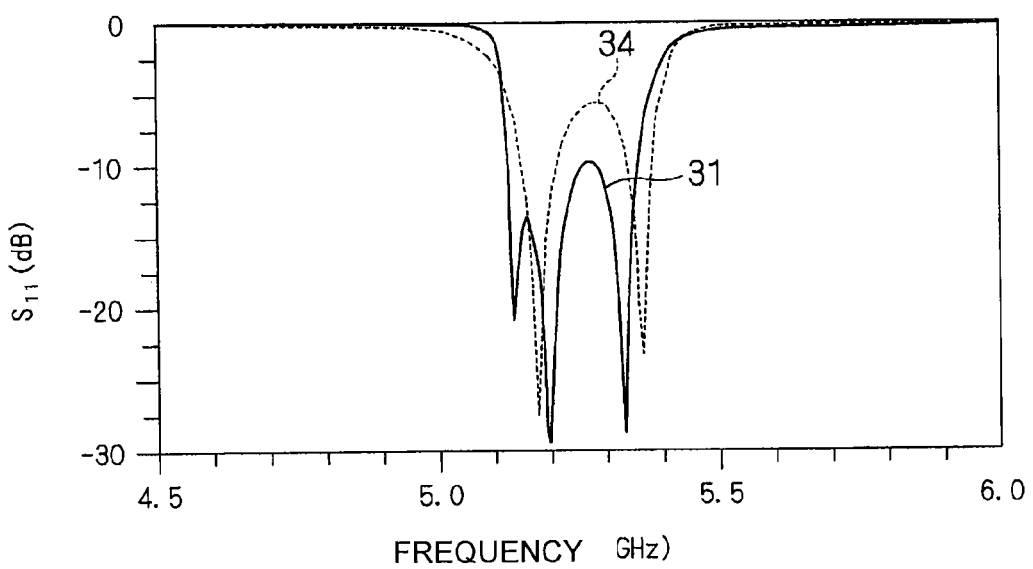
FIG. 10 is a graph of filter characteristics (first embodiment and comparative example)
Figure 11:
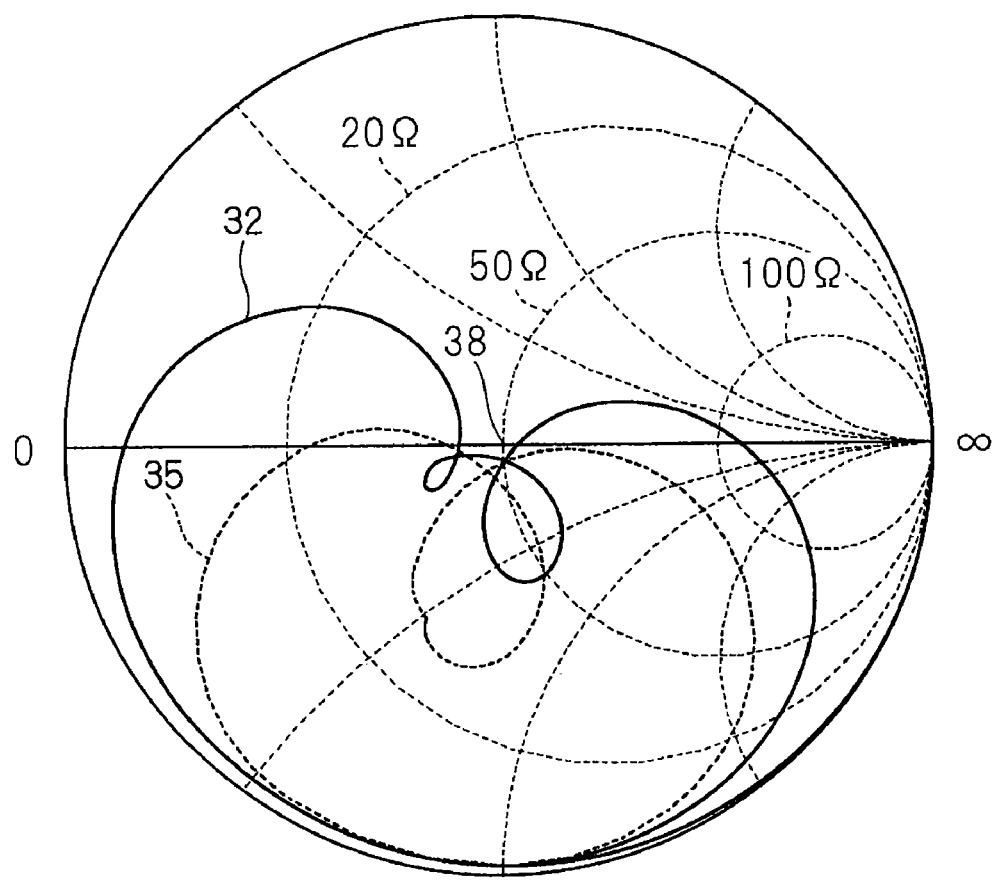
FIG. 11 is a Smith chart showing filter characteristics (first embodiment and comparative example)

Regarding the comparative example and the embodiment, FIG. 9 shows transmission characteristics ($S_{21}$), FIG. 10 shows reflection characteristics ($S_{11}$), and FIG. 11 shows a Smith chart (frequency ranges from 1.000 GHz to 9.000 GHz) of the reflection characteristics ($S_{11}$). Referring to FIGS. 9 to 11, the characteristics of the embodiment are represented by solid lines 30 to 32, and the characteristics of the comparative example are represented by broken lines 33 to 35.

As shown in FIG. 9, the embodiment 30 has improved steepness compared with that of the comparative example 33 at a lower frequency side of a passband, which is indicated by reference numeral 36. Further, the embodiment 30 has improved steepness at a level equivalent to that of the comparative example 33 at a higher frequency side of the passband, which is indicated by reference numeral 37.

As shown in FIG. 10, the embodiment 31 has reduced $S_{11}$ (reflection) compared with that of the comparative example 34. This is because, as shown in FIG. 11, the impedances near the lower frequency side of the passband are such that, whereas the comparative example 35 has capacitance impedance (lower than the horizontal axis), the embodiment 32 has inductive impedance, which is greatly shifted to the positive side on circles of constant resistance and which winds around near a point 38 at 50 Ω.

Second Embodiment

A piezoelectric thin-film filter 40 according to a second embodiment will be described with reference to FIGS. 12 to 16.

In the second embodiment, two types of operating frequencies are employed, and additional resonators are connected in parallel, without increasing the number of steps.

Figure 12:
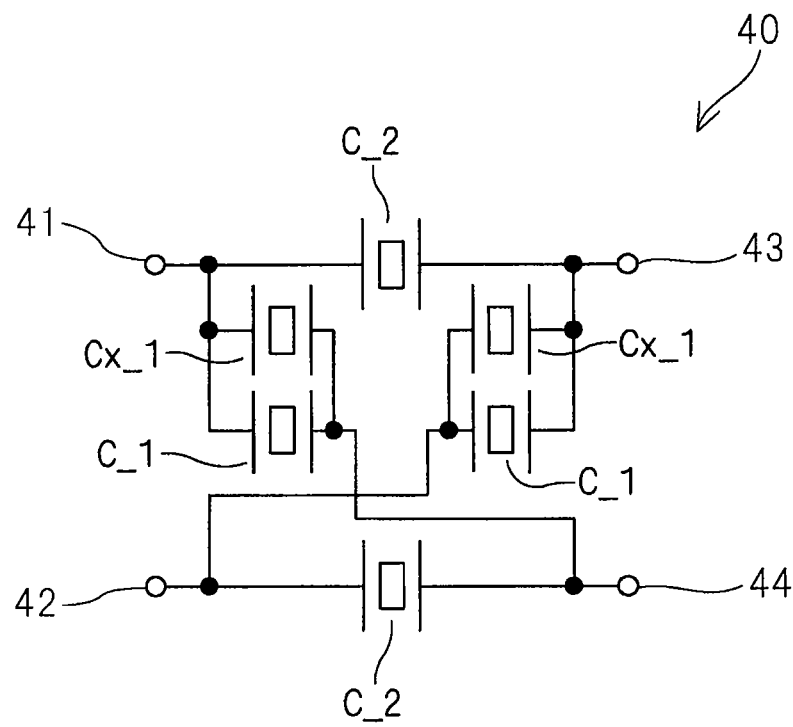
FIG. 12 is a circuit diagram of a filter (second embodiment)

As shown in a circuit diagram of FIG. 12, the piezoelectric thin-film filter 40 includes, as in the first embodiment, two series-arm resonators C_2 and two parallel-arm resonators C_1 connected in a lattice pattern between input terminals 41 and 42 and output terminals 43 and 44. Further, additional resonators Cx_1 are connected in parallel to the corresponding parallel-arm resonators C_1.

In the piezoelectric thin-film filter 40, unlike the first embodiment, the resonant frequency of each additional resonator Cx_1 and the resonant frequency of each series-arm resonator C_2 are the same. In the case where the piezoelectric thin-film filter 40 is configured using BAW resonators employing vibration in the thickness direction, the additional resonators Cx_1 and the series-arm resonators C_2 can be formed using the same film thickness, resulting in a reduction in the number of steps.

As an example, the case where the capacitance of the parallel-arm resonator C_1 is 0.18 pF, the capacitance of the series-arm resonator C_2 is 0.3 pF, and the capacitance of the additional resonator Cx_1 is 0.12 pF will be described.

The anti-resonant frequency of the parallel-arm resonator C_1 is 5440 MHz, and $k^2$=5.8%. The anti-resonant frequency of the additional resonator Cx_1 is 5245 MHz, and $k^2$=5.8%. The anti-resonant frequency of the series-arm resonator C_2 is 5245 MHz, and $k^2$=5.8%.

Figure 13:
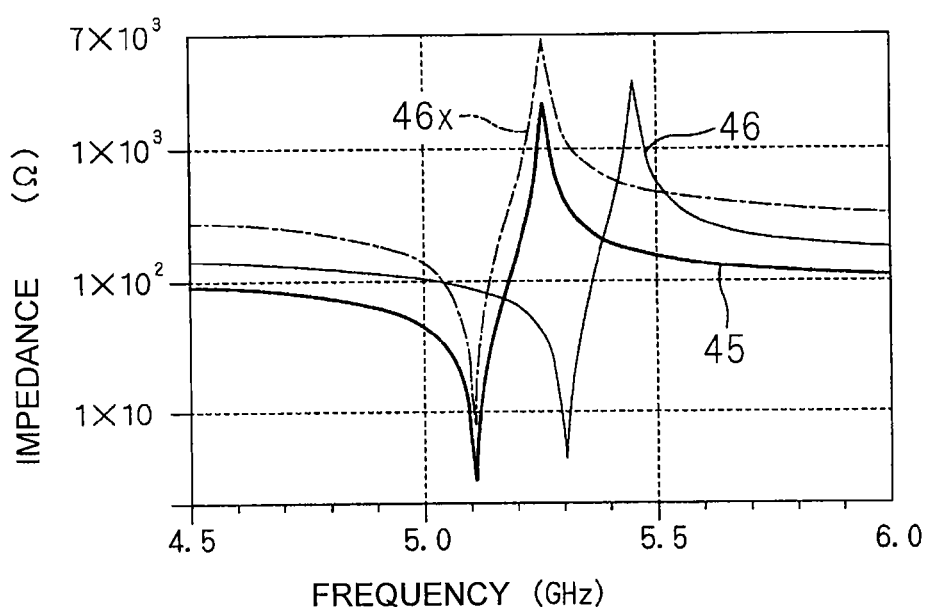
FIG. 13 is a graph of impedance characteristics (second embodiment)
Figure 14:
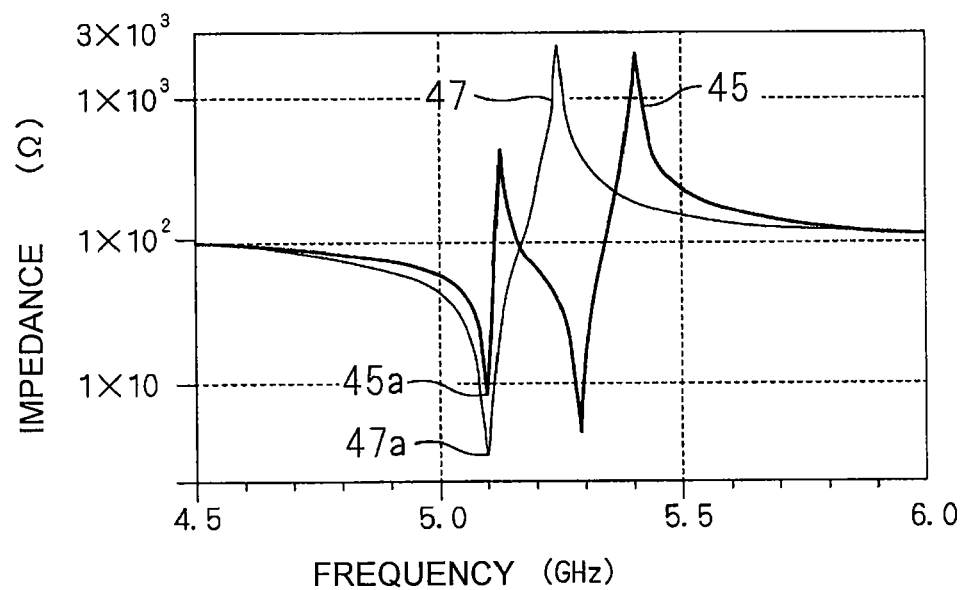
FIG. 14 is a graph of impedance characteristics (second embodiment)
Figure 15:
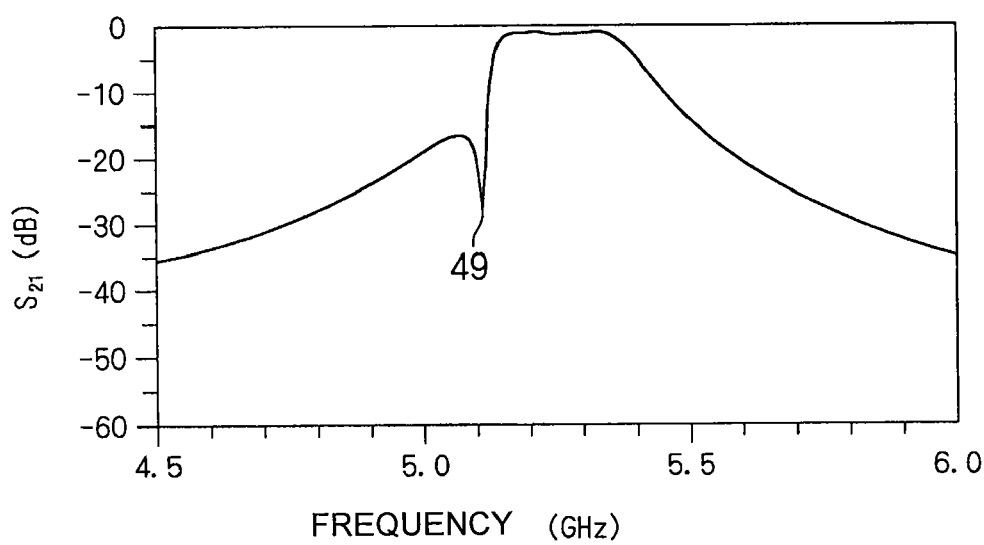
FIG. 15 is a graph of filter characteristics (second embodiment)
Figure 16:
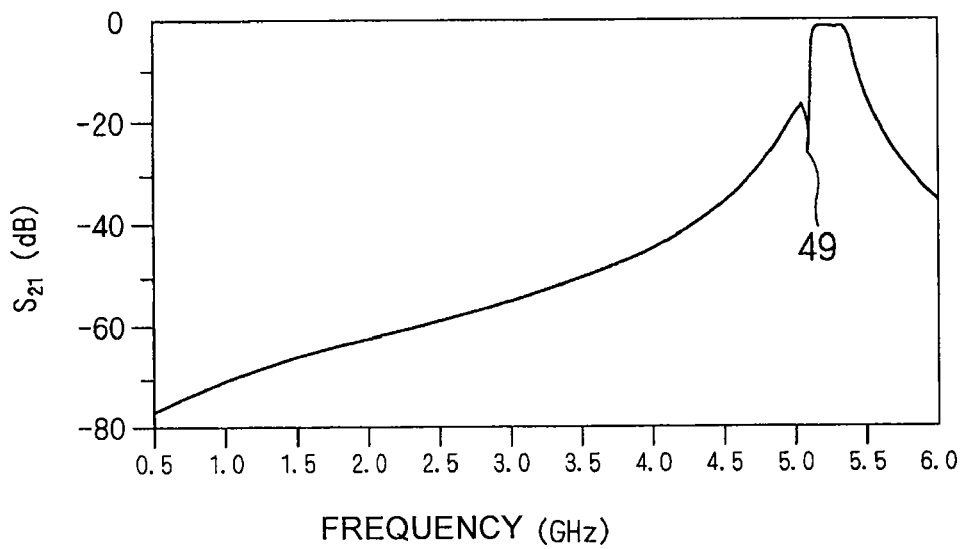
FIG. 16 is a graph of filter characteristics (second embodiment)

FIGS. 13 and 14 show impedance characteristics of the resonators in the case where the operating frequency of each resonator is made different. FIGS. 15 and 16 show filer characteristics. FIG. 14 is an enlarged illustration of a part of the graph shown in FIG. 13. FIG. 15 is an enlarged illustration of a part of the graph shown in FIG. 16.

Referring to FIGS. 13 and 14, the bold line 45 represents impedance characteristics of the series-arm resonator C_2. Referring to FIG. 13, the thin line 46 represents impedance characteristics of the parallel-arm resonator C_1, and the chain line 46x represents impedance characteristics of the additional resonator Cx_1. Referring to FIG. 14, the thin line 47 represents the composite impedance obtained by connecting the parallel-arm resonator C_1 and the additional resonator Cx_1 in parallel to each other.

As shown in FIG. 14, the frequency at a resonant point 45a (5.105 GHz, 2.988 Ω), which is outside a passband, of the impedance characteristic curve 45 of the series-arm resonator C_2 matches the frequency at a resonant point 47a of the composite impedance characteristic curve 47 of the parallel-arm resonator C_1 and the additional resonator Cx_1.

Accordingly, as shown in FIGS. 15 and 16, an attenuation pole 49 is formed near the passband, and steep filter characteristics in which out-of-band attenuation is large can be achieved.

Alternatively, the additional resonators Cx_1 may be connected in parallel to the two series-arm resonators C_2 instead of the parallel-arm resonators C_1. In this case, the operating frequency of each additional resonator Cx_1 is set to be the same as that of each parallel-arm resonator C_1.

The filter characteristics can be improved by connecting the additional resonator Cx_1 having the same operating frequency as the other one of the series-arm resonator C_2 and the parallel-arm resonator C_1 to one of the series-arm resonator C_2 and the parallel-arm resonator C_1 having different operating frequencies.

Third Embodiment

Figure 18:
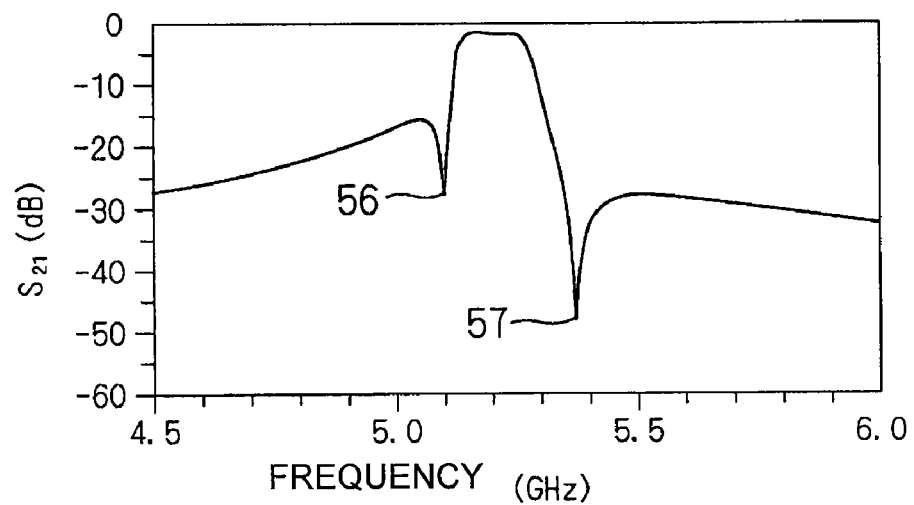
FIG. 18 is a graph of filter characteristics (third embodiment)
Figure 19:
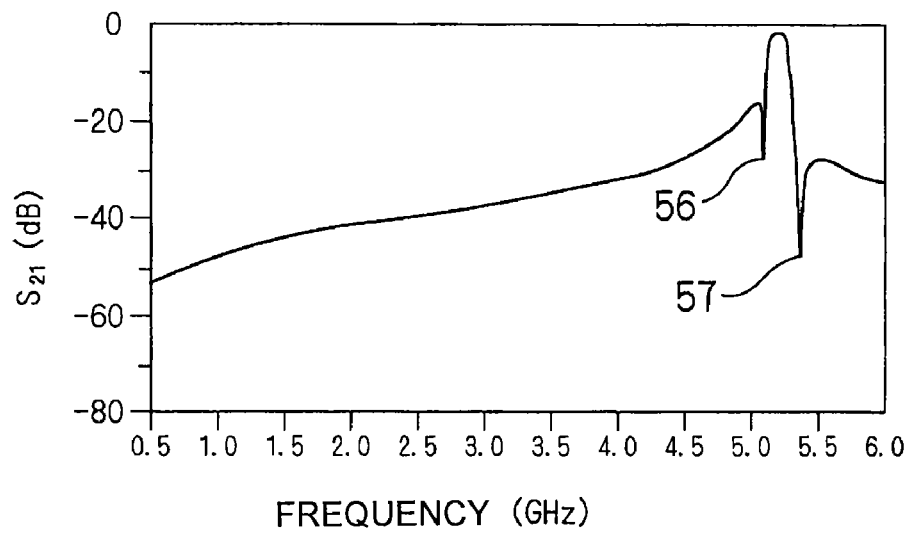
FIG. 19 is a graph of filter characteristics (third embodiment)

A filter according to a third embodiment will be described with reference to FIGS. 17 to 19.

The third embodiment employs two types of operating frequencies and different $k^2$, thereby achieving steep attenuation near two ends of a passband. A circuit diagram of the third embodiment is the same as that in the first and second embodiments, the drawing and description of which are omitted.

The resonant frequency of each additional resonator connected to one of a parallel-arm resonator and a series-arm resonator is set to be the same as that of the other resonator including no additional resonator. That is, two types of frequencies are employed.

Further, $k^2$ of the additional resonator and $k^2$ of the resonator including the additional resonator are made different by one the following methods:

(1) by changing the ratio among the electrodes and the piezoelectric film; and
(2) by enabling operation using a second harmonic wave.

A specific example of (1) is shown in Table 1 summarizing the structure and a film-thickness value of a vibrating portion:

TABLE 1

|  |  | C_2/Cx_1 | C_1 |
|---|---|---|---|
| Upper electrode film | Al/Pt | 105/30 (nm) | 105/190 (nm) |
| Piezoelectric thin film | AlN | 510 (nm) | 210 (nm) |
| Lower electrode film | Pt/Al | 70/30 (nm) | 70/30 (nm) |
| Band | $k^2$ (%) | 5.8 | 2.7 |

A specific example of (2) is shown in Table 2 summarizing the structure and a film-thickness value of a vibrating portion:

TABLE 2

|  |  | C_2/Cx_1 | C_1 |
|---|---|---|---|
| Temperature characteristic adjusting film | SiO$_2$ | 0 | 600 (nm) |
| Upper electrode film | Al/Pt | 105/30 (nm) | 105/190 (nm) |
| Piezoelectric thin film | AlN | 510 (nm) | 210 (nm) |
| Lower electrode film | Pt/Al | 70/30 (nm) | 70/30 (nm) |
| Band | $k^2$ (%) | 5.8 | 2.7 |

An example of the case where the capacitance of the parallel-arm resonator C_1 is 0.2 pF, the capacitance of the series-arm resonator C_2 is 0.3 pF, and the capacitance of the additional resonator Cx_1 is 0.1 pF will be described.

The parallel-arm resonator C_1 and the additional resonator Cx_1 have different operating frequencies and different $k^2$. That is, the anti-resonant frequency of the parallel-arm resonator C_1 is 5310 MHz, and $k^2$=2.7%. The anti-resonant frequency of the additional resonator Cx_1 is 5245 MHz, and $k^2$=5.8%. The anti-resonant frequency of the series-arm resonator C_2 is 5245 MHz, and $k^2$=5.8%.

Figure 17:
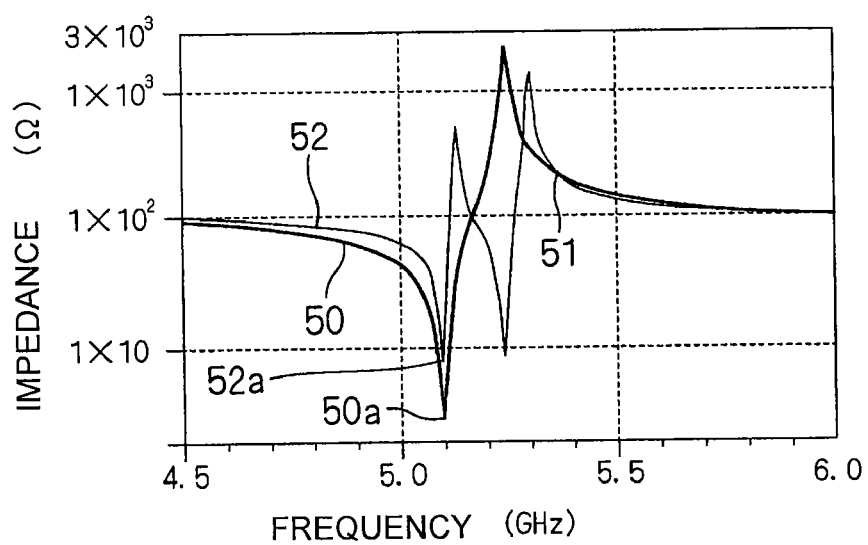
FIG. 17 is a graph of impedance characteristics (second embodiment)

FIG. 17 shows impedance characteristics. FIGS. 18 and 19 show filter characteristics.

Referring to FIG. 17, the bold line 50 represents impedance characteristics of the series-arm resonator C_2, and the thin line 52 represents the composite impedance characteristics of the parallel-arm resonator C_1 and the additional resonator Cx_1 connected in parallel to each other. The bold line 50 and the thin line 52 show that the frequencies (resonant frequencies) at resonant points 50a (5.095 GHz, 2.988 Ω) and 52a match each other, and impedances at an out-of-band point 51 (5.369 GHz, 214.857 Ω) match each other. Accordingly, attenuation poles 56 and 57 are formed near two ends of the passband at lower and higher frequency sides, and steep filter characteristics in which out-of-band attenuation is large can be achieved as shown in FIGS. 18 and 19. With the attenuation pole 57 at the higher frequency side, the filter characteristics can be further improved, compared with the first and second embodiments.

Fourth Embodiment

Figure 21:
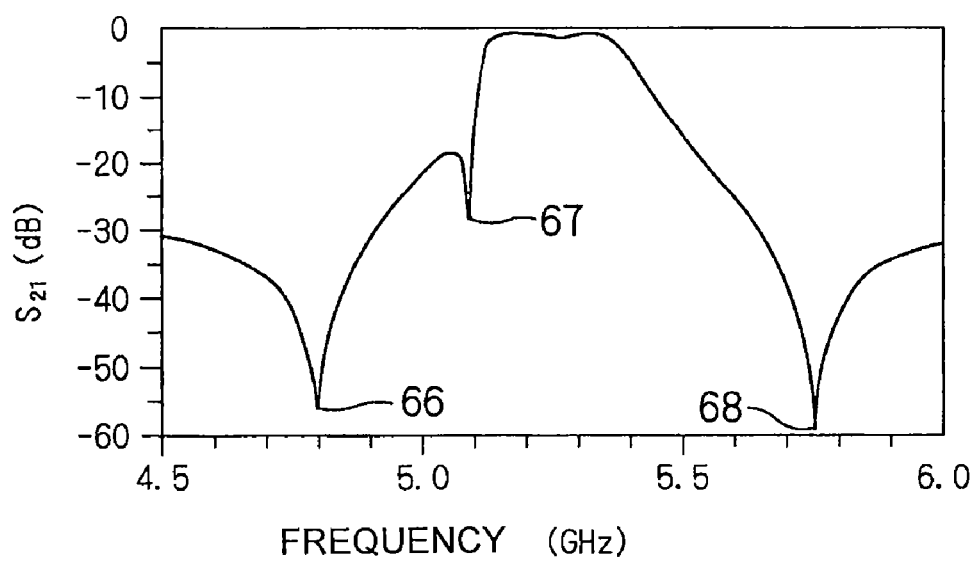
FIG. 21 is a graph of filter characteristics (fourth embodiment)
Figure 22:
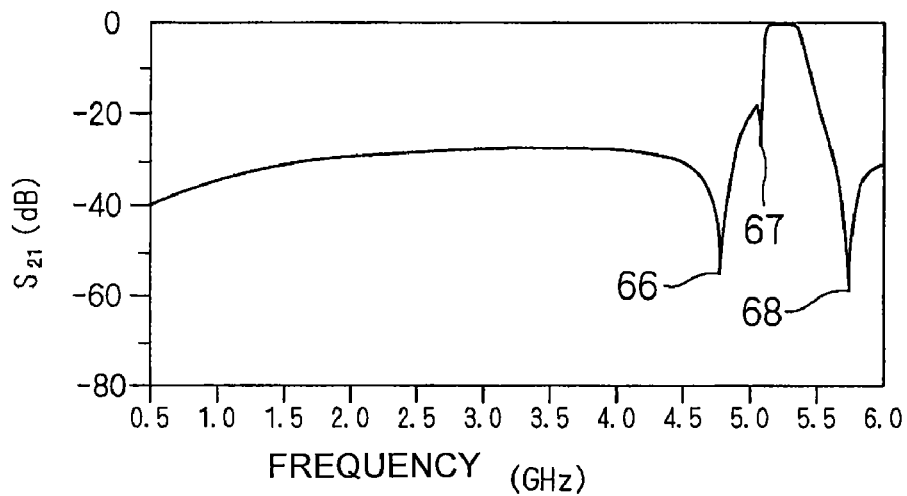
FIG. 22 is a graph of filter characteristics (fourth embodiment)
Figure 22:
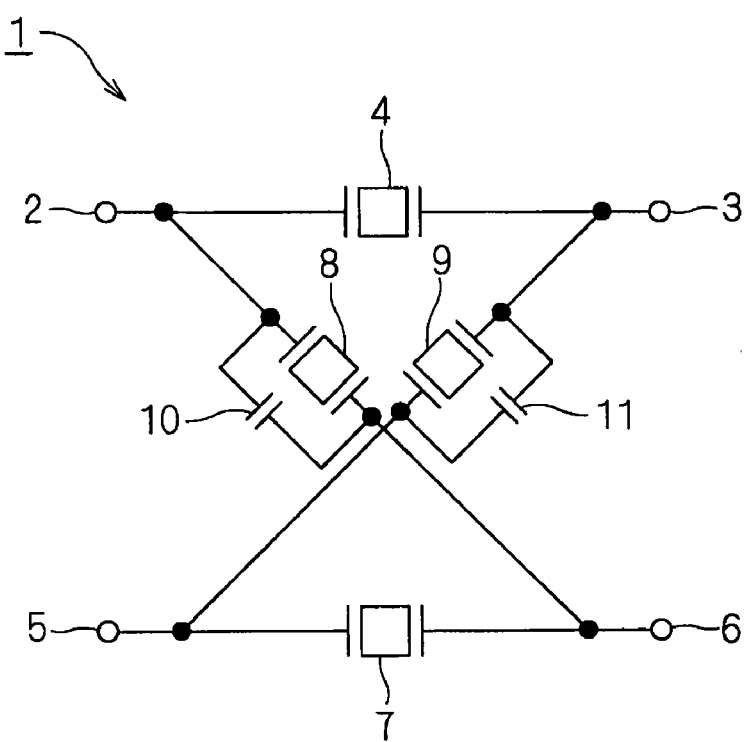

A filter according to a fourth embodiment will be described with reference to FIGS. 20 to 22.

In the fourth embodiment, the series-arm composite capacitance is made different from the parallel-arm composite capacitance, and steep attenuation is achieved near two ends of the passband at higher and lower frequency sides. A circuit diagram of the fourth embodiment is the same as that in the first and second embodiments, the drawing and description of which are omitted.

In the fourth embodiment, as in the third embodiment, the resonant frequency of each additional resonator connected to one of a parallel-arm resonator and a series-arm resonator is set to be the same as that of the other resonator including no additional resonator. That is, two types of frequencies are employed.

In the first to third embodiments, the capacitance of the series-arm resonator C_2 is the same as the composite capacitance of the parallel-arm resonator C_1 and the additional resonator Cx_1. However, the two capacitances are slightly different in the fourth embodiment.

An example of the case where the capacitance of the parallel-arm resonator C_1 is 0.22 pF, the capacitance of the series-arm resonator C_2 is 0.3 pF, and the capacitance of the additional resonator Cx_1 is 0.11 pF will be described.

The anti-resonant frequency of the parallel-arm resonator C_1 is 5450 MHz, and $k^2$=5.8%. The anti-resonant frequency of the additional resonator Cx_1 is 5245 MHz, and $k^2$=5.8%. The anti-resonant frequency of the series-arm resonator C_2 is 5245 MHz, and $k^2$=5.8%.

Figure 20:
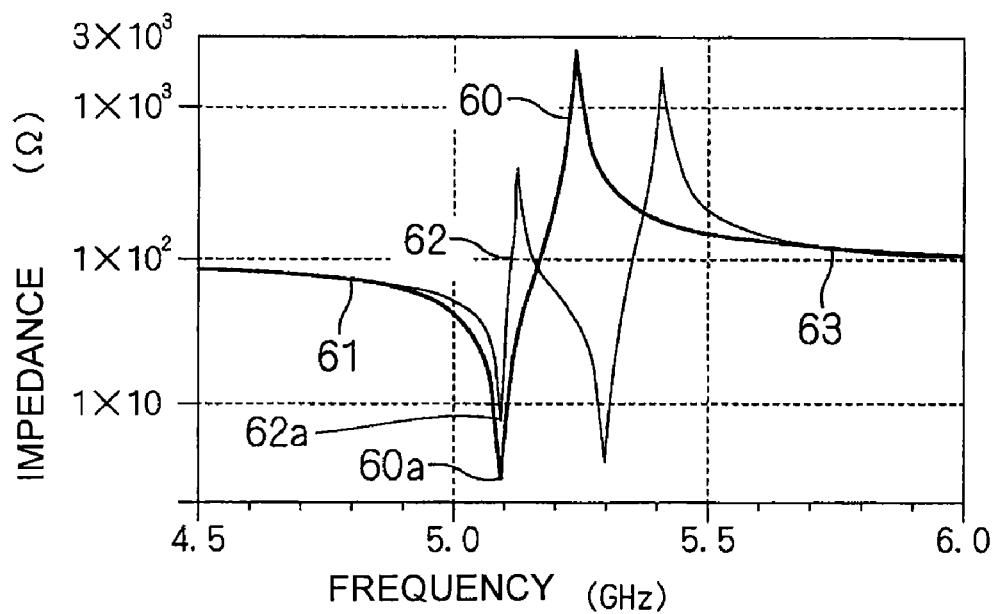
FIG. 20 is a graph of impedance characteristics (fourth embodiment)

FIG. 20 shows impedance characteristics. FIGS. 21 and 22 show filter characteristics. FIG. 21 is an enlarged illustration of a part of the graph shown in FIG. 22.

Referring to FIG. 20, the bold line 60 represents impedance characteristics of the series-arm resonator C_2, and the thin line 62 represents composite impedance characteristics of the parallel-arm resonator C_1 and the additional resonator Cx_1 connected in parallel to each other. The bold line 60 and the thin line 62 show that impedances match each other at an out-of-band point 61 (4.796 GHz, 72.565 Ω) and point 63 (5.748 GHz, 118.154 Ω) Also, the frequency at a resonant point 60a (5.095 GHz, 2.988 Ω) of the series-arm resonator C_2 matches the frequency at a resonant point 62a of the parallel-arm resonator C_1 and the additional resonator Cx_1 connected in parallel to each other. Accordingly, attenuation poles 66, 67, and 68 are formed near two ends of the passband at lower and higher frequency sides, as shown in FIGS. 21 and 22, and steep filter characteristics in which out-of-band attenuation is large can be achieved.

CONCLUSION

The additional resonators can be formed at the same time as the series-arm resonators and the parallel-arm resonators. A process of fabricating a piezoelectric thin-film filter does not involve an additional special step. Even a resonator operates as a capacitor at frequencies lower than its resonant frequency and higher than its anti-resonant frequency. Using this principle, a γ value ($=1/k^2$) is adjusted, thereby achieving large attenuation at frequencies away from the passband and improving the steepness near two ends of the passband.

A band pass filter for a 5-GHz W-LAN is required to have characteristics in which large attenuation is achieved at frequencies away from a passband and the attenuation is steep near two ends of the passband in order to prevent the band pass filter from being interfered with by a 2.4-GHz wireless LAN and other apparatuses using frequencies around 2 GHz. Since the piezoelectric thin-film filters according to the first to fourth embodiments satisfy these requirements, these piezoelectric thin-film filters are suitable for 5-GHz W-LAN band pass filters.

The present invention is not limited to the embodiments described above, and various changes thereof are possible.

For example, instead of connecting an additional resonator in parallel to a parallel-arm resonator, the additional resonator may be connected in parallel to a series-arm resonator. The number of stages in a lattice filter is not limited to two as in the first to fourth embodiments, and three or more stages may be included in the lattice filter.

The invention claimed is:

1. A piezoelectric thin-film filter comprising pluralities of first, second, and third resonators, each resonator comprising a pair of electrodes sandwiching a piezoelectric thin film,
   wherein the second resonators or the first and third resonators connected in parallel are disposed so as to constitute series-arm resonators or parallel-arm resonators connected in a lattice pattern,
   wherein the capacitance of each of the second resonators is larger than the capacitance of each of the first resonators,
   wherein the capacitance of each of the third resonators is substantially equal to the difference between the capacitance of any one of the second resonators and the capacitance of any one of the first resonators,
   wherein the resonant frequency of each of the first resonators is higher than the resonant frequency of each of the second resonators, and
   wherein the anti-resonant frequency of each of the third resonators is higher than the resonant frequency of each of the second resonators and lower than the resonant frequency of each of the first resonators.

2. The piezoelectric thin-film filter according to claim 1, wherein the resonant frequency of each of the third resonators matches the resonant frequency of each of the second resonators.

3. The piezoelectric thin-film filter according to claim 2, wherein the sum of the capacitance of any one of the first resonators and the capacitance of any one of the third resonators is equal to the capacitance of any one of the second resonators.

4. The piezoelectric thin-film filter according to claim 3, wherein the difference between the anti-resonant frequency and the resonant frequency of any one of the first resonators is smaller than the difference between the anti-resonant frequency and the resonant frequency of any one of the second resonators.

5. The piezoelectric thin-film filter according to claim 2, wherein the sum of the capacitance of any one of the first resonators and the capacitance of any one of the third resonators is different from the capacitance of any one of the second resonators.

6. The piezoelectric thin-film filter according to claim 5, wherein the difference between the anti-resonant frequency and the resonant frequency of any one of the first resonators is smaller than the difference between the anti-resonant frequency and the resonant frequency of any one of the second resonators.

7. The piezoelectric thin-film filter according to claim 2, wherein the difference between the anti-resonant frequency and the resonant frequency of any one of the first resonators is smaller than the difference between the anti-resonant frequency and the resonant frequency of any one of the second resonators.

8. The piezoelectric thin-film filter according to claim 1, wherein the sum of the capacitance of any one of the first resonators and the capacitance of any one of the third resonators is equal to the capacitance of any one of the second resonators.

9. The piezoelectric thin-film filter according to claim 8, wherein the difference between the anti-resonant frequency and the resonant frequency of any one of the first resonators is smaller than the difference between the anti-resonant frequency and the resonant frequency of any one of the second resonators.

10. The piezoelectric thin-film filter according to claim 1, wherein the sum of the capacitance of any one of the first resonators and the capacitance of any one of the third resonators is different from the capacitance of any one of the second resonators.

11. The piezoelectric thin-film filter according to claim 10, wherein the difference between the anti-resonant frequency and the resonant frequency of any one of the first resonators is smaller than the difference between the anti-resonant frequency and the resonant frequency of any one of the second resonators.

12. The piezoelectric thin-film filter according to claim 1, wherein the difference between the anti-resonant frequency and the resonant frequency of any one of the first resonators is smaller than the difference between the anti-resonant frequency and the resonant frequency of any one of the second resonators.

13. The piezoelectric thin-film filter according to claim 1, wherein the second resonators or the first and third resonators connected in parallel are disposed so as to constitute series-arm resonators.

14. The piezoelectric thin-film filter according to claim 1, wherein the second resonators or the first and third resonators connected in parallel are disposed so as to constitute parallel-arm resonators.

15. A method of forming a piezoelectric thin-film filter comprising providing pluralities of first, second, and third resonators, each resonator comprising a pair of electrodes sandwiching a piezoelectric thin film, and in which (a) the capacitance of each of the second resonators being larger than the capacitance of each of the first resonators, the capacitance of each of the third resonators being substantially equal to the difference between the capacitance of any one of the second resonators and the capacitance of any one of the first resonators, the resonant frequency of each of the first resonators being higher than the resonant frequency of each of the second resonators, and the anti-resonant frequency of each of the third resonators being higher than the resonant frequency of each of the second resonators and lower than the resonant frequency of each of the first resonators; and disposing the second resonators or the first and third resonators connected in parallel so as to constitute series-arm resonators or parallel-arm resonators connected in a lattice pattern.

16. The method according to claim 15, wherein the resonant frequency of each of the provided third resonators matches the resonant frequency of each of the provided second resonators.

17. The method according to claim 15, wherein the sum of the capacitance of any one of the provided first resonators and the capacitance of any one of the provided third resonators is equal to the capacitance of any one of the provided second resonators.

18. The method according to claim 15, wherein the sum of the capacitance of any one of the provided first resonators and the capacitance of any one of the provided third resonators is different from the capacitance of any one of the provided second resonators.

19. The method according to claim 15, wherein the difference between the anti-resonant frequency and the resonant frequency of any one of the provided first resonators is smaller than the difference between the anti-resonant frequency and the resonant frequency of any one of the provided second resonators.

* * * * *